(12) United States Patent
Fiedler (10) Patent No.: US 8,415,980 B2
(45) Date of Patent: Apr. 9, 2013

(54) SERIALIZING TRANSMITTER

(75) Inventor: Alan S. Fiedler, Mountain View, CA (US)

(73) Assignee: Microsoft Corporation, Redmond, WA (US)

( * ) Notice: Subject to any disclaimer, the term of this patent is extended or adjusted under 35 U.S.C. 154(b) by 2 days.

(21) Appl. No.: 13/170,585

(22) Filed: Jun. 28, 2011

(65) Prior Publication Data

US 2013/0002300 A1 Jan. 3, 2013

(51) Int. Cl.
*H03K 19/094* (2006.01)
*H03B 1/00* (2006.01)

(52) U.S. Cl.
USPC ............................................. 326/83; 327/108

(58) Field of Classification Search .............. 326/83, 326/82, 86, 87, 68, 112, 115, 126, 127; 327/108, 327/109
See application file for complete search history.

(56) References Cited

U.S. PATENT DOCUMENTS

| | | | |
|---|---|---|---|
| 4,742,532 A | 5/1988 | Walker | |
| 5,572,721 A | 11/1996 | Rostamian | |
| 5,805,089 A | 9/1998 | Fiedler et al. | |
| 5,939,929 A | 8/1999 | Tsinker | |
| 6,078,514 A | 6/2000 | Takemae et al. | |
| 6,085,257 A | 7/2000 | Ducaroir et al. | |
| 6,400,616 B1 | 6/2002 | Tamura et al. | |
| 6,490,628 B2 | 12/2002 | Hindie et al. | |
| 6,677,793 B1 | 1/2004 | Chan et al. | |
| 7,187,721 B1* | 3/2007 | Dally et al. | 375/295 |
| 7,571,340 B2 | 8/2009 | Jiang | |
| 7,814,250 B2 | 10/2010 | Bracamontes Del Toro | |
| 7,848,367 B2 | 12/2010 | Hornbuckle et al. | |
| 2002/0000853 A1* | 1/2002 | Chen et al. | 327/156 |
| 2007/0156932 A1* | 7/2007 | Kasahara et al. | 710/71 |
| 2009/0116839 A1* | 5/2009 | Kikuchi et al. | 398/79 |
| 2010/0076385 A1* | 3/2010 | Huang et al. | 604/263 |
| 2012/0224613 A1* | 9/2012 | Loh | 375/219 |
| 2013/0007500 A1 | 1/2013 | Fiedler | |

OTHER PUBLICATIONS

Keezer, Daivd et al., "Low-Cost 20 Gbps Digital Test Signal Synthesis Using SiGe and InP Logic", *Journal of Electronic Testing*, vol. 26, Issue 1, Available at <http://www.springerlink.com/content/p249376832175780/>,(Jan. 15, 2010),pp. 87-96.

Young, Ian "Introducing Intel's chip-to-chip optical I/O interconnect technology", Retrieved from: <http://www.deviceforge.com/articles/AT3588366215.html> on Mar. 1, 2011, (Apr. 2, 2004),5 pages.

(Continued)

*Primary Examiner* — Shawki S Ismail
*Assistant Examiner* — Dylan White
(74) *Attorney, Agent, or Firm* — Wolfe-SBMC (57) ABSTRACT

In embodiments of a serializing transmitter, the serializing transmitter includes one or more multiplexing drive units that each generate a series of output pulses derived from input data signals and multi-phase clock signals. Each of the multiplexing drive units includes a pulse-controlled push-pull output driver that has first and second inputs, and an output coupled to an output of the multiplexing drive unit. Each of the multiplexing drive units also includes a first M:1 (where M is two or more) pulse-generating multiplexer having an output coupled to the first input of the pulse-controlled push-pull output driver, and generating a first series of intermediate pulses at the output; and a second M:1 pulse-generating multiplexer having an output coupled to the second input of the pulse-controlled push-pull output driver, and generating a second series of intermediate pulses at the output.

16 Claims, 7 Drawing Sheets

OTHER PUBLICATIONS

Fiedler, Alan "High-Speed I/O Data System", U.S. Appl. No. 13/170,444,(Jun. 28, 2011),34 pages.

"Stratix II GX Device Data sheet", Retrieved at <<http://www.altera.com/literature/hb/stx2gx/stxiigx_sii5v1_01.pdf>>, Oct. 2007, pp. 316.

Kim, et al., "A 3.4Gbps Transmitter for Multi-Serial Data Communication", Retrieved at <<http://www.wseas.us/e-library/conferences/2010/Harvard/CISST/CISST-27.pdf>>, Proceedings of the 4th WSEAS international conference on Circuits, systems, signal and telecommunications, 2010, pp. 153-156.

Kumar, et al., "A Family of 45nm IA Processors", Retrieved at <<http://ieeexplore.ieee.org/xpl/freeabs_all.jsp?reload=true&arnumber=4977306>>, IEEE International Conference on Solid-State Circuits, Feb. 9, 2009, pp. 58-59.

"High-Speed I/O Data System", pp. 34.

* cited by examiner

SERIALIZING TRANSMITTER

BACKGROUND

Conventional high-speed I/O data circuits to transfer large volumes of data at high speeds across short distances, such as from chip-to-chip on the same circuit board, are frequently inadequate for the task. The specifications for many industry-standard I/O interfaces were outlined nearly a decade ago, and are general purpose designs that attempt to meet a wide-range of design needs, but are not optimal for any one design. Additionally, implementations of I/O data circuits that utilize packet-based communication have a large memory requirement that may come with a significant latency penalty. Alternatively, attempts at full-custom I/O solutions are often less than optimal due to the improper application of digital design methods, induced power supply noise, and lack of signal integrity control. Chip designers are often faced with the dilemma of system implementation on a single, larger chip having a low yield and a high manufacturing cost with the benefit of faster intra-chip data communication, or system implementation with multiple chips having a higher yield and an overall lower manufacturing cost, but with slower inter-chip data communication.

A common technique for high-speed data serialization and transmission includes a 2:1 multiplexer followed by an output buffer, and uses CMOS multiplexers to generate two ½-rate NRZ data streams that are directed to a 2:1 multiplexer controlled by a ½-rate clock. The 2:1 multiplexer then sends a full-rate NRZ data stream to an output driver that is implemented either as a CML parallel-terminated driver or as a push-pull series-terminated driver. Two factors limit both maximum bandwidth and achievable power efficiency. The first factor is the design of a 2:1 multiplexer with sufficient bandwidth to avoid inter-symbol interference (ISI) at the output, because any ISI-induced data-dependent jitter is further amplified by the output driver and channel due to finite bandwidth. This design limitation can be accounted for through appropriate sizing of the 2:1 multiplexer, but this in turn can lead to excessive power consumption. The second factor is that setup and hold time requirements for the 2:1 multiplexer is increasingly difficult to achieve reliably at very high data rates.

SUMMARY

This Summary introduces simplified concepts of a serializing transmitter, and the concepts are further described below in the Detailed Description and/or shown in the Figures. This Summary should not be considered to describe essential features of the claimed subject matter, nor used to determine or limit the scope of the claimed subject matter.

In embodiments of a serializing transmitter, the serializing transmitter includes one or more multiplexing drive units that each generate a series of output pulses derived from input data signals and multi-phase clock signals. Each of the multiplexing drive units includes a pulse-controlled push-pull output driver that has first and second inputs, and an output coupled to an output of the multiplexing drive unit. Each of the multiplexing drive units also includes a first M:1 (where M is two or more) pulse-generating multiplexer having an output coupled to the first input of the pulse-controlled push-pull output driver, and generating a first series of intermediate pulses at the output; and a second M:1 pulse-generating multiplexer having an output coupled to the second input of the pulse-controlled push-pull output driver, and generating a second series of intermediate pulses at the output.

In other embodiments, serializing and transmitting serial data from parallel data includes coupling together outputs of at least two push-pull output drivers; controlling a source resistance of the two push-pull output drivers with a first feedback control loop; generating, using CMOS logic gates, a pull-up sequence of pulses and a pull-down sequence of pulses for each push-pull output driver to control the output driver, based on multi-phase clock signals and the parallel data; and controlling a width and alignment of said pulses with a second feedback control loop.

BRIEF DESCRIPTION OF THE DRAWINGS

Embodiments of a serializing transmitter are described with reference to the following Figures. The same numbers may be used throughout to reference like features and components that are shown in the Figures.

DETAILED DESCRIPTION

Embodiments of a serializing transmitter for chip-to-chip, chip-to-memory, and chip-to-optical-module NRZ (non-return-to-zero) data communication is described. The circuit topology of a serializing transmitter provides for low-power, high-speed operation and includes four pulse-toggled 2:1 CMOS multiplexers to form an 8:4 first stage of serialization, followed by a final pulse-controlled 4:1 serializer that is also a push-pull output driver, consuming one-quarter (¼) the power of a comparable parallel-terminated output driver. The first stage uses high-speed, rail-to-rail CMOS logic and consumes no static power, and its topology provides that the magnitude of its power supply current at each bit time is constant and independent of data. The push-pull output driver has a programmable source resistance, and when implemented differentially, consumes constant current when terminated at the receiver, again independent of data. Because of its constant current draw, the power supply bypass capacitance requirements of a serializing transmitter are minimized.

The integration of multi-chip systems, such as game consoles and other multi-processor computer systems onto a single large chip can reduce costs by eliminating sometimes costly chip-to-chip data communication. However, if chip-to-chip data communication costs and other multi-chip costs can be reduced to less than the costs of integration (such as lower yield and higher cooling costs due to higher power density), a cost savings is obtained with a multi-chip solution. With a sufficiently low-cost, high-performance I/O, a multi-chip solution may be implemented rather than single-chip integration. Additionally, the performance of very large, frequently I/O-bound systems, such as Internet servers and supercomputers, can be improved with gains in I/O performance, be it an increase in data rate or a reduction in power.

In embodiments, a low-cost, area- and power-efficient CMOS serializing transmitter device addresses the need for both high speed and low power, and can be implemented for data communication between chips in the same package, on the same board, and on different boards across a backplane. The CMOS logic provides for superior speed-power ratio across a wide range of data rates, as well as portability across technology nodes, including future nodes that will provide further performance gains and power reduction. In spite of the use of CMOS logic, a serializing transmitter presents a largely constant current load to its power supply. Within the device, parallel signal paths generate multiple streams of data-controlled pulses to control a final 4:1 multiplexer that is also the output driver. The source termination resistance of a serializing transmitter is controlled over process, voltage, and temperature (PVT) to match the resistance of an external reference resistor.

While features and concepts of a serializing transmitter can be implemented in any number of different devices, systems, environments, and/or configurations, embodiments of a serializing transmitter are described in the context of the following example devices, systems, and methods.

Figure 1:
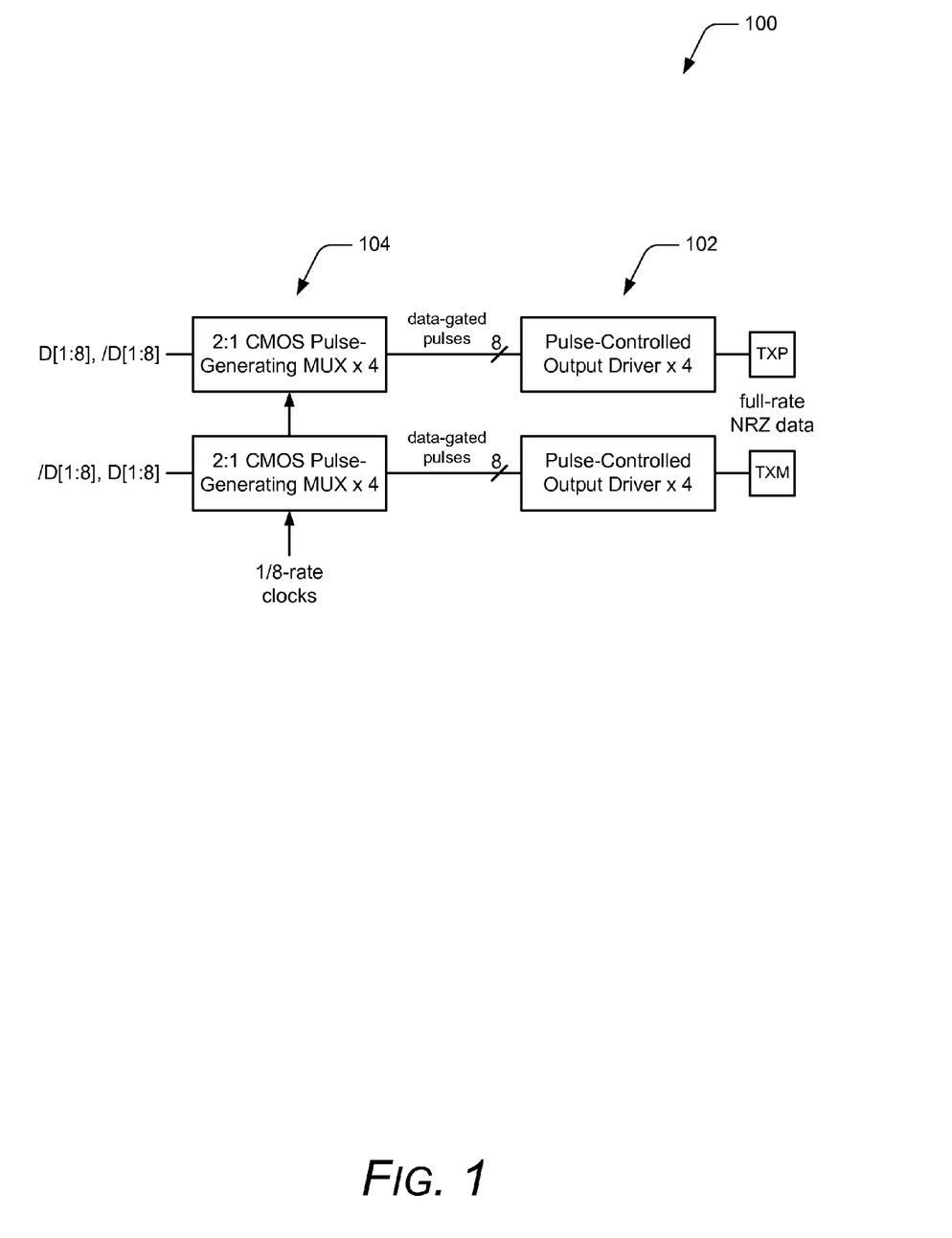
FIG. 1 illustrates an example of a high-speed differential serializing transmitter in accordance with one or more embodiments.

FIG. 1 illustrates an example of a high-speed differential serializing transmitter 100. A series-terminated output driver 102 includes a 4:1 multiplexer function by the wire-OR'ing of the outputs of four pulse-controlled series-terminated output drivers. For low-power operation, the series-terminated output driver provides the same output signal amplitude at one-fourth (¼) of the power of a parallel-terminated output driver. Pulses can be utilized for multiplexer control, and the serializing transmitter 100 has a two-stage method of pulse generation. The serializing transmitter uses those pulses to control a push-pull series-terminated multiplexing output driver, rather than a CML multiplexer. Input signaling to the output driver includes ¼-rate data-gated CMOS pulses, rather than a full-rate NRZ data stream, so no individual pulse can interfere with any other pulse, and there is no contribution to inter-symbol interference in the final NRZ data stream. To generate data-controlled pulses for the each output driver, four 2:1 CMOS pulse-generating multiplexers 104 are controlled by eight ⅛-rate clocks and eight bits of data. The phases of the clocks are evenly distributed through 360 degrees. Although the serializing transmitter is described as a differential serializing transmitter, it can also be implemented as a single-ended serializing transmitter.

Figure 2:
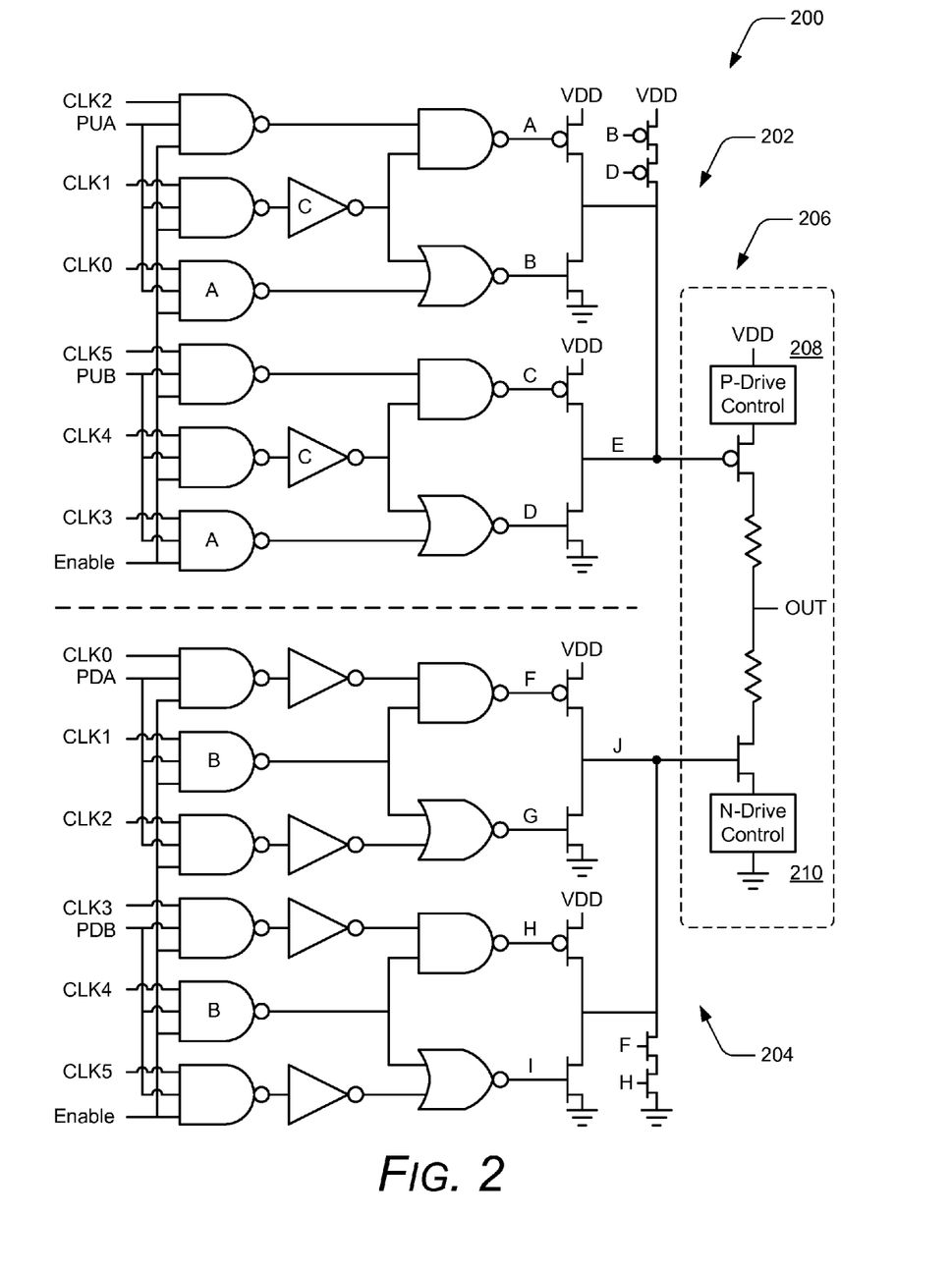
FIG. 2 illustrates an example of a multiplexing drive unit (MDU) in accordance with one or more embodiments.
Figure 3:
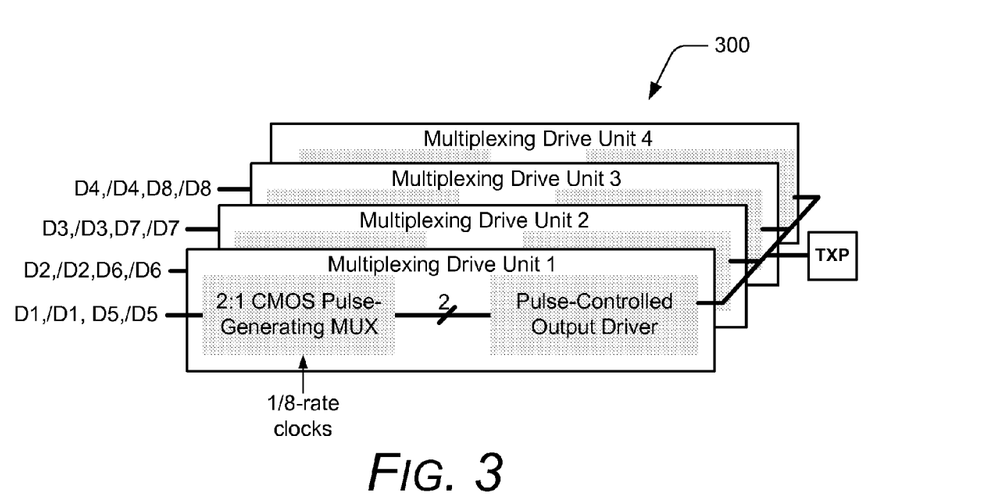
FIG. 3 illustrates an example of a serializing transmitter implemented with four MDUs in accordance with one or more embodiments.

FIG. 2 illustrates an example of a multiplexing drive unit (MDU) 200 that includes a pulse-generating pull-up multiplexer 202, a pull-down 2:1 multiplexer 204, and a pulse-controlled output driver 206. FIG. 3 illustrates an example 300 of connecting four MDUs to form an 8:1 single-ended serializing transmitter, where each MDU asserts onto the serializing transmitter output a high or low drive level for two of eight bit times and asserts no drive level for six bit times.

Within each MDU, two data-controlled pulse generators form a 2:1 multiplexer which generates pulses to control a pull-up transistor of the output driver. A second pair of data-controlled pulse generators generate controlling pulses for a second 2:1 multiplexer, which in turn generates pulses to control a pull-down transistor of the output driver. Within the data-controlled pulse generator, an assertion pulse generator (a NAND or NOR gate, depending on pulse polarity) generates a pulse that induces a transition at the 2:1 multiplexer output from a de-asserted state to an asserted state. A de-assertion pulse generator (a NOR or NAND gate) generates a pulse one bit time later to induce a transition at the 2:1 multiplexer output from its asserted state to its de-asserted state.

Small keeper transistors can be used to hold the 2:1 multiplexer output in its de-asserted state until the arrival of the next assertion pulse, which could occur as few as two bit-times later, or might never occur, as its arrival is dependent on the data pattern. In an alternative implementation, the de-assertion pulses are not gated by data, thereby ensuring that a de-assertion pulse always occurs and rendering the keeper transistors unnecessary. This alternative implementation consumes slightly more power. Bidirectional capability of the serializing transmitter is inherent in the construction of the MDUs, as their outputs can be tri-stated by de-asserting all data inputs.

In FIG. 2, the pulse-controlled output driver 206 of the MDU 200 includes a P-drive control 208 and an N-drive control 210. Using a feedback control loop to control the resistance of the P-drive control and the N-drive control, an MDU's drive resistance tracks an external reference resistor and is programmable.

Figure 4:
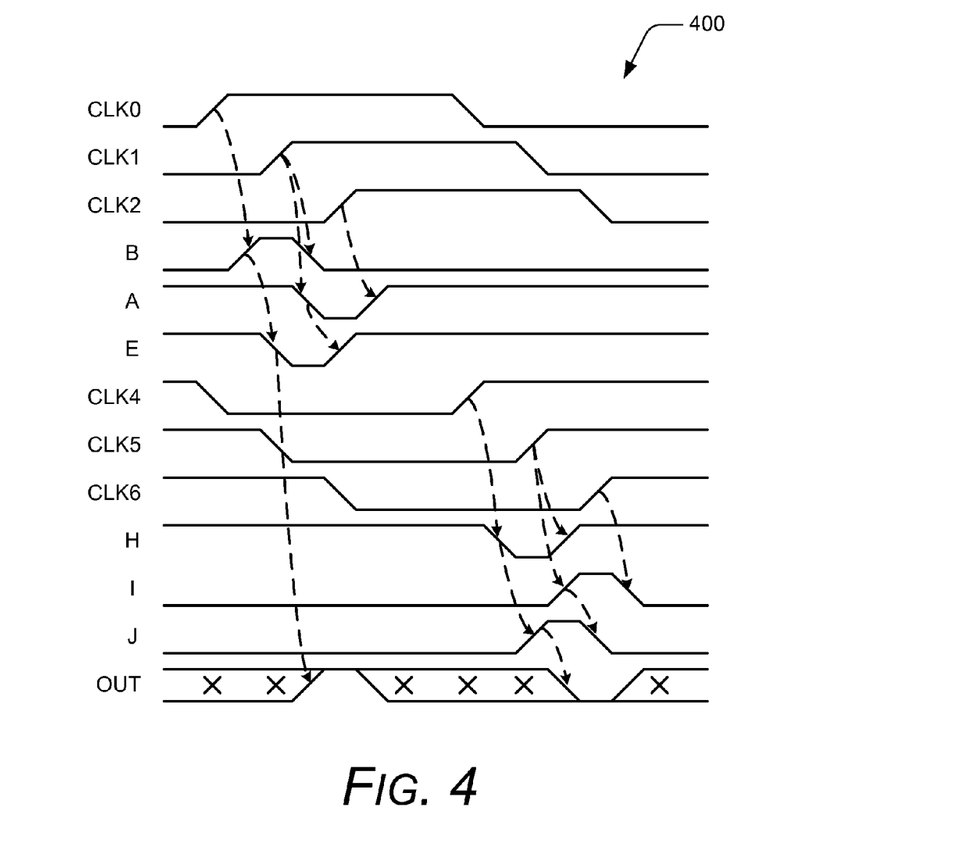
FIG. 4 illustrates an example of the functionality and timing of an MDU in accordance with one or more embodiments.

FIG. 4 illustrates an example 400 of the functionality and timing of a single MDU during eight bit-times when PUA=PDB=1 and PDA=PUB=0 (PUA, PDB, PDA, and PUB are shown in FIG. 2). Here, the MDU asserts a high level at its output in one bit time, and asserts a low level at its output four bit times later. During the other six bit-times, the MDU output is tri-stated.

Several aspects of the MDU contribute to its high-speed and low-power operation, and five aspects are described. In the first aspect, NRZ data is carried on just one net, OUT, and there is no longer the need for a 2:1 multiplexer to generate a full-rate, pre-driver NRZ data stream to drive an output driver. This provides for substantial power savings and an overall bandwidth improvement over previous implementations, as there is no pre-driver NRZ data stream that limits performance and may itself be in need of equalization. Apart from OUT, the highest-speed nets of the MDU do not carry NRZ data, but rather, single pulses one bit-time wide. Because these pulses occur no more frequently than every fourth bit-time on any given net, they have a full three bit-times to return to the de-asserted level, and do not contribute to ISI at OUT. Any ISI that may appear in the NRZ data stream at OUT is readily corrected by standard transmit de-emphasis and receive equalization circuits used to correct for channel-induced ISI.

In a second aspect, the MDU serializes two stages of pulse-toggled multiplexing, deriving substantial speed-power advantage from each stage. In a third aspect, an inherently low-power push-pull series terminated output driver is integrated with a high-performance pulse-toggled 4:1 multiplexer. This provides for both a reduction in power and an increase in speed, compared to conventional techniques where these functions are implemented separately. In a fourth aspect, the circuit topology contributes to high bandwidth on its highest-speed nets in two different ways. First, the gates that create and transfer these pulses all have very low fan-out (between ½ and 1) and very low fan-in (between 1 and 2). Second, the topology allows for the nets that carry these pulses (nets A-J in FIG. 2) to be physically very short. In a fifth aspect, by gating clocks CLK0-CLK7 with the data signals PUA, PUB, PDA, and PDB at the very root of the logic paths in the MDU, signal transitions and therefore power are minimized.

Figure 5:
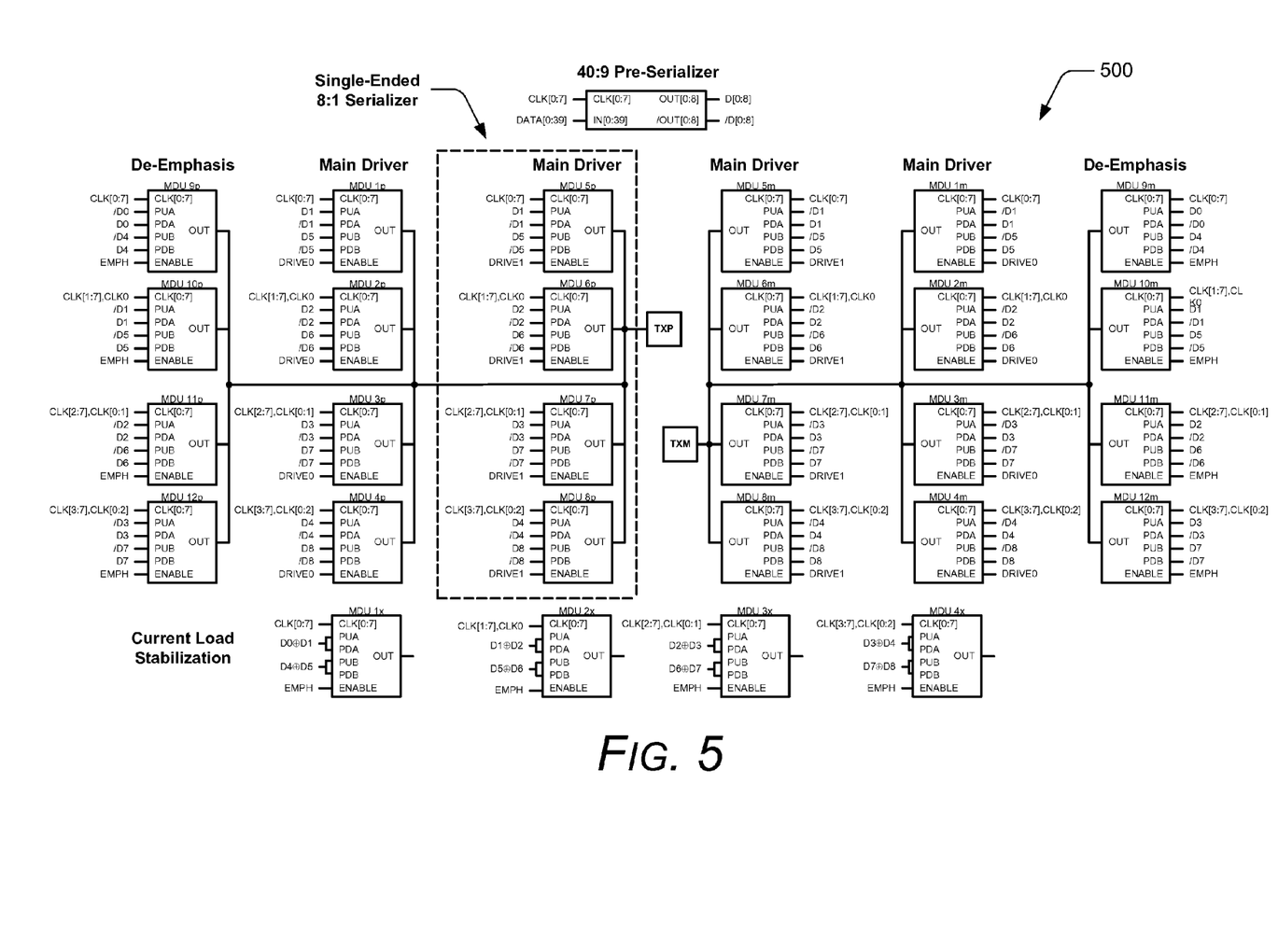
FIG. 5 illustrates an example of an 8:1 differential serializing transmitter with de-emphasis and power supply current load balancing in accordance with one or more embodiments.

FIG. 5 illustrates an example 500 of connecting twenty-four MDUs to form an 8:1 differential serializing transmitter with de-emphasis. MDU[1-8]p and MDU[1-8]m form a main tap of the differential serializing transmitter, and MDU[9-12]p and MDU[9-12]m provide de-emphasis to TXP and TXM during those bit times following no data transition. In contrast to a traditional current-steering output driver with de-emphasis, the application of de-emphasis in this serializing transmitter results in a small increase in power supply current load. MDU[1-4]x, small scaled replicas of the primary MDUs, balance this increase by presenting an extra current load to the power supply during those bit times immediately following any transition (i.e., when de-emphasis is not applied). This is achieved with the application of appropriate XOR of data to MDU[1-4]x. The magnitude of this extra power supply current load is programmable. A 40:9 pre-serializer provides appropriately timed data and de-emphasis data for the MDUs.

To optimize circuit performance, feedback control loops adjust transmit drive resistance, de-emphasis magnitude, and the insertion delay of certain paths within the MDUs. Under digital control, each feedback control loop can be disabled or offset by a programmable amount.

Figure 6:
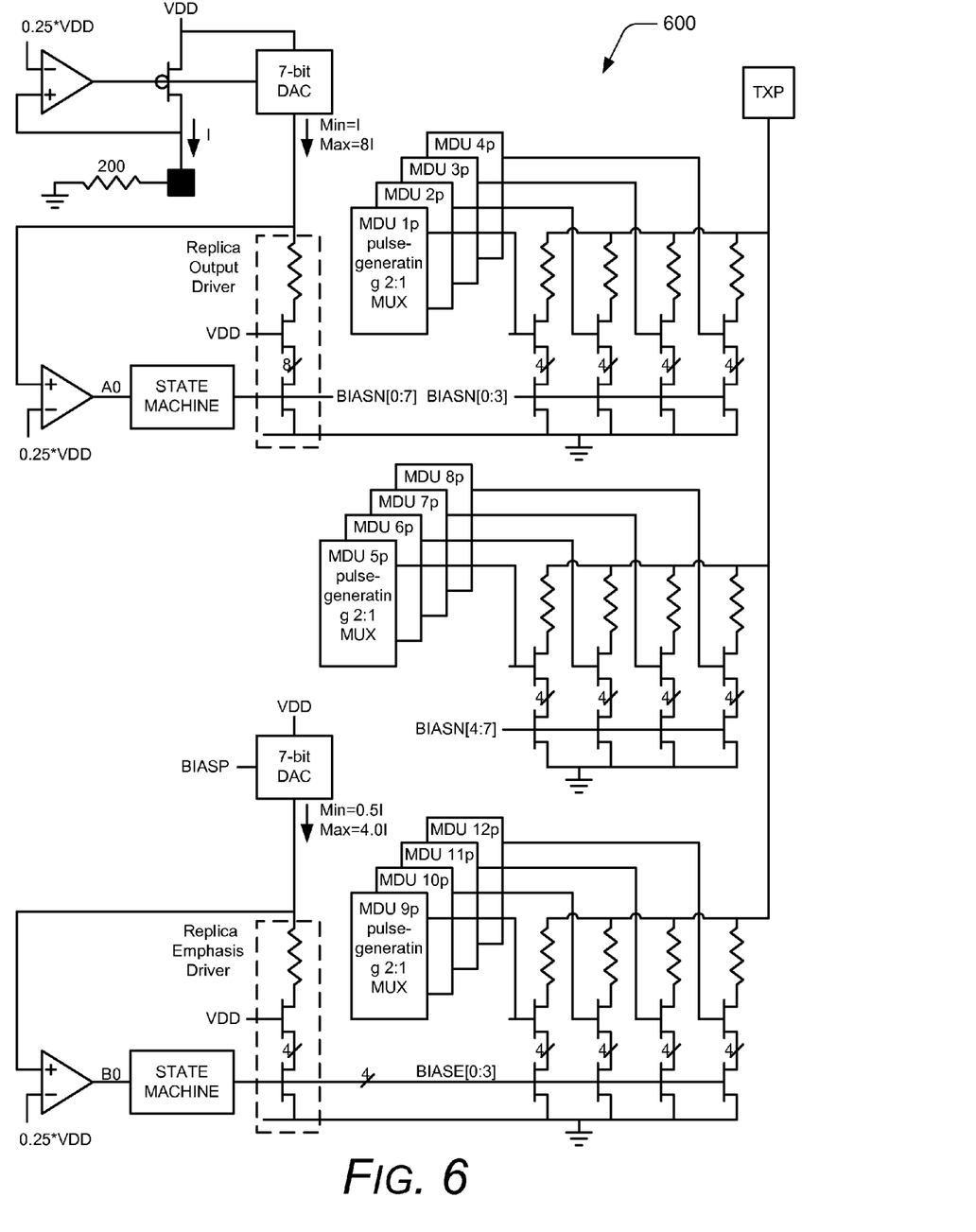
FIG. 6 illustrates a pull-down drive resistance and de-emphasis control circuit in accordance with one or more embodiments of a serializing transmitter.

FIG. 6 illustrates an example 600 of an MDU pull-down output transistor detail and the control of MDU drive resistance with selectable, equal-weighted output drive segments. A generated current is sourced to an off-chip reference resistor, and a scaled multiple of that current is also sent to an on-chip replica of the output driver. On startup, a state machine asserts control bits BIASN[0:7] to VDD in sequence, thereby turning on segments in the replica output driver one at a time until the voltage at the output of the replica output driver is less than the voltage at the reference resistor. At this time, no additional control bits are asserted, and an analog feedback control loop is then enabled by disconnecting the asserted bits of BIASN[0:7] from VDD and connecting them to net A0. The de-asserted bits of BIASN[0:7] remain held at 0V. The analog feedback control loop then adjusts the voltage of the asserted bits of BIASN[0:7] until the drive resistance of the replica pull-down output driver is the desired fraction of the external reference resistor, independent of PVT. A 7-bit DAC provides for adjustment of pull-down drive resistance from 25 ohms to 200 ohms in 128 steps. Also shown is a replica emphasis pull-down driver and a second 7-bit DAC for the adjustment of emphasis driver pull-down drive resistance from 50 ohms to 400 ohms in 128 steps. Similar circuits and methods control pull-up output transistor drive resistance.

Note the use of analog feedback control of the BIASN[0:7] and BIASE[0:3] voltages to provide a high resolution of drive resistance control. Because of this analog control, the resolution of drive resistance control is not constrained by the number of driver segments that are independently controlled, but rather 128 levels of termination resistance are achieved with just eight segments.

Overlap of the interleaved pulses that control the final 4:1 multiplexer of the serializing transmitter directly impacts the quality of the transmit eye. As has been described, the serializing transmitter is implemented from multiple MDUs, each generating a share of interleaved output pulses. When these pulses overlap, two output transistors will for a time both be on. If they fail to overlap, no output driver will be on for a time. Non-optimum overlap results in an elevated common-mode transmit signal amplitude as well as transmit eye closure.

Figure 7:
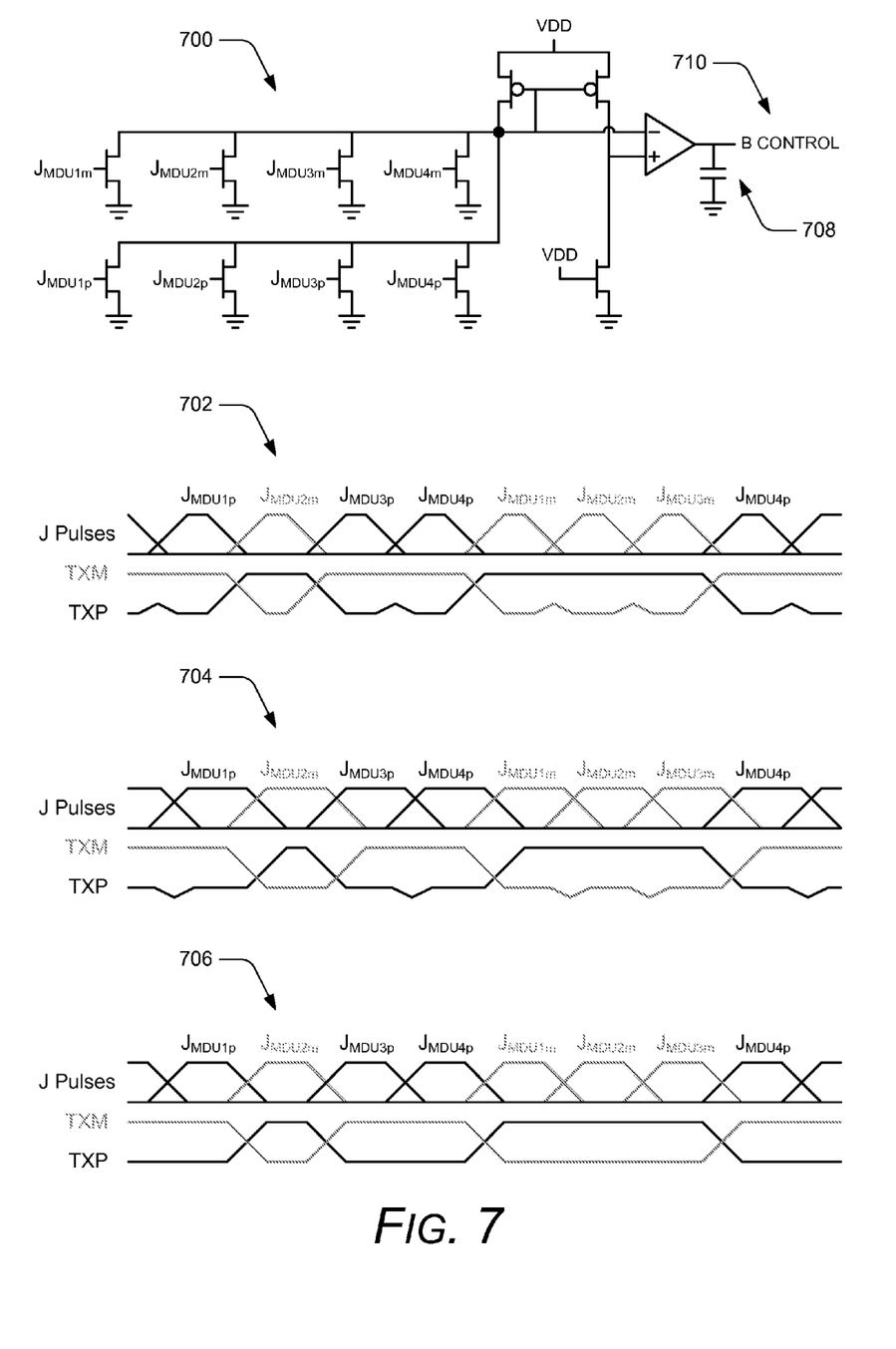
FIG. 7 illustrates a pulse width control circuit in accordance with one or more embodiments of a serializing transmitter.

FIG. 7 illustrates an example control circuit 700 used to optimize the overlap of pulses on the J-nets of FIG. 2. FIG. 7 further illustrates cases of too little overlap 702, too much overlap 704, and optimum overlap 706. By measuring the difference between a sum of currents generated by the J-pulses and a current generated by a signal that is always high (i.e., at Vdd), the overlap of the J-pulses is determined. Filter capacitor 708 converts this current difference to a control voltage 710 that is used to adjust the insertion delay of the MDU "B" NAND gates shown in FIG. 2. When the J-pulses overlap high or low, the control voltage will fall or rise so as to narrow or widen the pulses. When the feedback control loop reaches steady-state, pulse overlap is optimum. A similar but complementary circuit is used to control the overlap of the MDU's active-low E-pulses by adjusting the insertion delay of the MDU "A" NAND gates shown in FIG. 2.

Related to overlap control of the MDUs' J-pulses and the MDUs' E-pulses, relative timing offset between the E-pulses and the J-pulses is minimized by another feedback control loop. This feedback control loop is implemented because the signal paths for the generation of these pulses are topologically different, and while these pulses can be aligned in simulation through careful transistor size adjustment, silicon behavior is likely to vary. When these pulses are offset in phase from each other, eye closure results. A complete I/O system that includes a receiver eye monitor can adjust the relative timing of these pulses by adjusting the insertion delay of MDU "C" inverters shown in FIG. 2 until a maximum eye width is detected at the receiver.

By lowering the cost of high-throughput, low-latency data interconnection, this serializing transmitter can lower costs by making the partitioning of a large system-on-a-chip onto multiple chips less costly than single-chip integration. It can also reduce the cost and improve the performance of any large system that requires substantial data communication to neighboring chips and memory, including supercomputers and Internet servers.

The described embodiments of a serializing transmitter can be implemented with various technologies other than CMOS technology. The voltage supply terminals can be relatively positive or relatively negative, depending upon the particular convention adopted and the technology used. The use of the terms "pull-up" and "pull-down" as described herein are arbitrary terms, and can refer to either a logic high-level or a logic low-level depending on the relative levels of the voltage supply terminals. Likewise, the term "coupled" can include various types of connections or couplings and can include a direct connection or a connection through one or more intermediate components.

Example method 800 is described with reference to FIG. 8 in accordance with one or more embodiments of a serializing transmitter. Generally, any of the services, functions, methods, procedures, components, and modules described herein can be implemented using software, firmware, hardware (e.g., fixed logic circuitry), manual processing, or any combination thereof. A software implementation represents program code that performs specified tasks when executed by a computer processor. The example methods may be described in the general context of computer-executable instructions, which can include software, applications, routines, programs, objects, components, data structures, procedures, modules, functions, and the like. The program code can be stored in one or more computer-readable storage media devices, both local and/or remote to a computer processor. The methods may also be practiced in a distributed computing environment by multiple computer devices. Further, the features described herein are platform-independent and can be implemented on a variety of computing platforms having a variety of processors.

Figure 8:
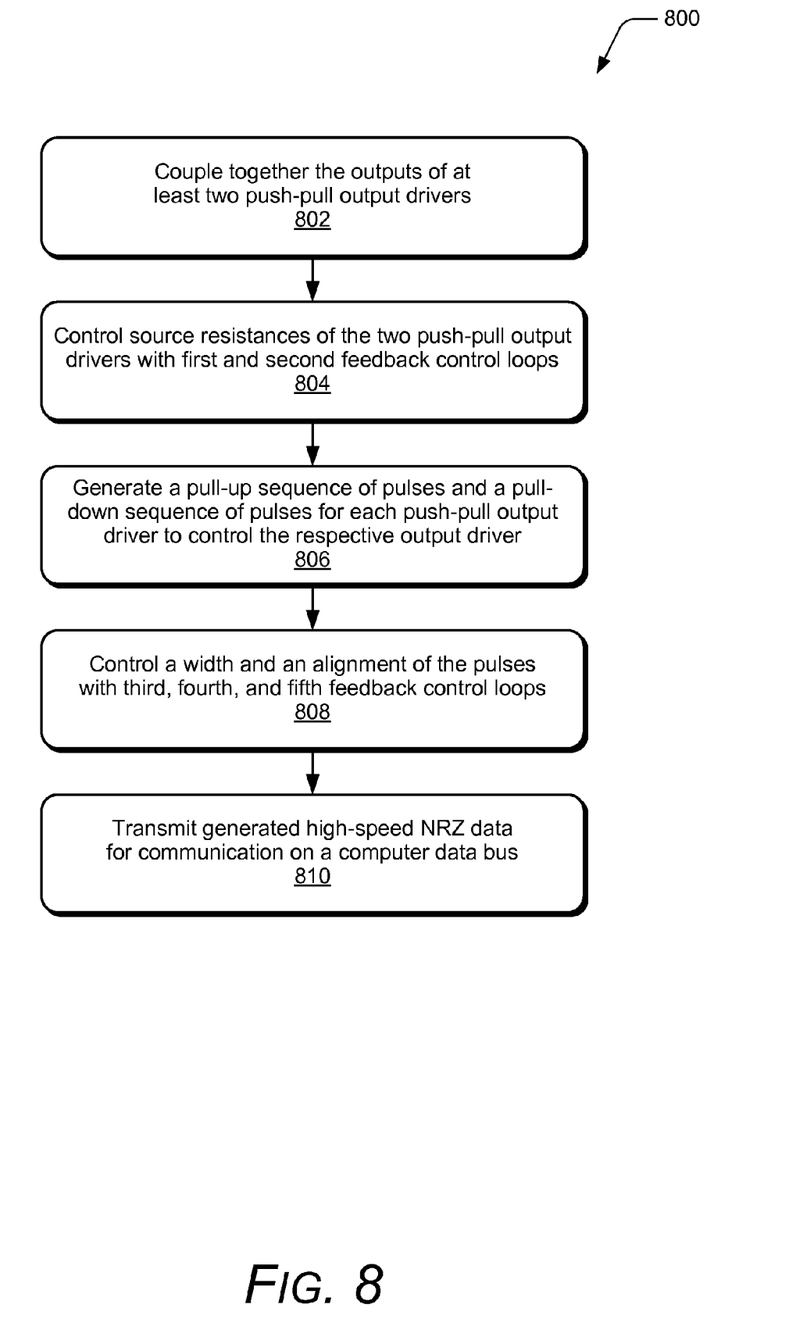
FIG. 8 illustrates example method(s) of a serializing transmitter in accordance with one or more embodiments.

FIG. 8 illustrates example method(s) 800 of a serializing transmitter to serialize and transmit serial data from parallel data. The order in which the method blocks are described are not intended to be construed as a limitation, and any number of the described method blocks can be combined in any order to implement a method, or an alternate method.

At block 802, the outputs of at least two push-pull output drivers are coupled together. At block 804, source resistances of the two push-pull output drivers is controlled with first and second feedback control loops. For example, a pull-up source resistance and a pull-down source resistance are controlled. At block 806, a pull-up sequence of pulses and a pull-down sequence of pulses are generated for each push-pull output driver to control the respective output driver, based on multi-phase clock signals and the parallel data. At block 808, a width and an alignment of the pulses are controlled with third, fourth, and fifth feedback control loops. At block 810, generated high-speed NRZ data is transmitted for communication on the computer data bus.

Although embodiments of a serializing transmitter have been described in language specific to features and/or methods, the subject of the appended claims is not necessarily limited to the specific features or methods described. Rather, the specific features and methods are disclosed as example implementations of a serializing transmitter.

The invention claimed is:

1. A serializing transmitter, comprising:
N multiplexing drive units, each configured to generate a series of output pulses derived from input data signals and multi-phase clock signals, wherein N is a positive integer, and wherein each multiplexing drive unit includes:
a pulse-controlled push-pull output driver having first and second inputs and an output coupled to an output of the multiplexing drive unit;
a first M:1 pulse-generating multiplexer having an output coupled to the first input of the pulse-controlled push-pull output driver and configured to generate a first series of intermediate pulses having a first pulse width at said output, where M is two or more; and
a second M:1 pulse-generating multiplexer having an output coupled to the second input of the pulse-controlled push-pull output driver and configured to generate a second series of intermediate pulses having a second pulse width at said output.

2. The serializing transmitter of claim 1, wherein the outputs of the multiplexing drive units are coupled together.

3. The serializing transmitter of claim 2, wherein:
M equals 2; and
a serial data signal having a data rate is generated at the coupled multiplexing drive unit outputs.

4. The serializing transmitter of claim 3, wherein the first 2:1 pulse-generating multiplexer includes first and second pulse generators, each having a data input, first, second and third clock inputs, and an output, and wherein said outputs of the first and second pulse generators are coupled together.

5. The serializing transmitter of claim 4, wherein the second 2:1 pulse-generating multiplexer includes third and fourth pulse generators, each having a data input, first, second and third clock inputs, and an output, and wherein said outputs of the third and fourth pulse generators are coupled together.

6. The serializing transmitter of claim 5, wherein the first and second pulse generators each comprise:
a first NAND gate coupled to the data input and the first clock input, and having a first NAND gate output;
an AND gate coupled to the data input and the second clock input, and having an AND gate output;
an inverter coupled to the third clock input, and having an inverter output;
a NOR gate coupled to the first NAND gate output and the AND gate output, and having a NOR gate output;
a second NAND gate coupled to the inverter output and the AND gate output, and having a second NAND gate output;
a p-type transistor having a drain, a gate, and a source, wherein the drain is coupled to the pulse generator output and the gate is coupled to the second NAND gate output; and
an n-type transistor having a drain, a gate, and a source, wherein the drain is coupled to the pulse generator output and the gate is coupled to the NOR gate output.

7. The serializing transmitter of claim 6, wherein the third and fourth pulse generators each comprise:
an AND gate coupled to the data input and the first clock input, and having an AND gate output;
a first NAND gate coupled to the data input and the second clock input, and having a first NAND gate output;
a NOR gate coupled to the first NAND gate output and the third clock input, and having a NOR gate output;
a second NAND gate coupled to the first NAND gate output and the AND gate output;
a p-type transistor having a drain, a gate, and a source, wherein the drain is coupled to the pulse generator output, the gate is coupled to the second NAND gate output, and the source is coupled to a positive power supply; and
an n-type transistor having a drain, a gate, and a source, wherein the drain is coupled to the pulse generator output and the gate is coupled to the NOR gate output.

8. The serializing transmitter of claim 7, further comprising:
a first feedback control loop configured to control insertion delays exhibited by the first NAND gate of the first and second pulse generators, wherein the first pulse width is substantially equal to the inverse of the data rate; and
a second feedback control loop configured to control said insertion delays exhibited by the first NAND gate of the third and fourth pulse generators, wherein the second pulse width is substantially equal to the inverse of the data rate; and
a third feedback control loop configured to control insertion delays exhibited by AND gates of the first and second pulse generators, wherein the pulses exhibit substantially optimum phase alignment relative to each other.

9. The serializing transmitter of claim 8, wherein:
an n-type voltage-controlled resistor having a first resistance is coupled between ground and the source of each n-type transistor; and
a p-type voltage-controlled resistor having a second resistance is coupled between the positive power supply and the source of each p-type transistor.

10. The serializing transmitter of claim 9, wherein the serializing transmitter exhibits a pull-up source resistance and a pull-down source resistance, and fourth and fifth feedback control loops control said source resistances by controlling the first and second resistances.

11. The serializing transmitter of claim 10, wherein each of the NAND gates, the AND gates, the NOR gates, and the inverters have a positive power supply terminal coupled to the positive power supply and have a negative power supply terminal coupled to ground.

12. The serializing transmitter of claim 11, wherein:

N equals 4;

the multi-phase clock signals comprise input clock signals 0, 1, 2, 3, 4, 5, 6, and 7 which are equally spaced in phase through 360 degrees; and the input data signals further comprise input data signals 0, 1, 2, 3, 4, 5, 6, and 7.

13. The serializing transmitter of claim 12, wherein for an integer n=0 to N−1:

the data input of the nth multiplexing drive unit's first pulse generator is coupled to input data signal n;

the data input of the nth multiplexing drive unit's second pulse generator is coupled to input data signal n+4;

the data input of the nth multiplexing drive unit's third pulse generator is coupled to a complement of input data signal n;

the data input of the nth multiplexing drive unit's fourth pulse generator is coupled to a complement of input data signal n+4;

the first clock inputs of the nth multiplexing drive unit's first and third pulse generators are coupled to input clock signal n;

the second clock inputs of the nth multiplexing drive unit's first and third pulse generators are coupled to input clock signal n+1;

the third clock inputs of the nth multiplexing drive unit's first and third pulse generators are coupled to input clock signal n+3;

the first clock inputs of the nth multiplexing drive unit's second and fourth pulse generators are coupled to input clock signal (n+4 modulo 2*N);

the second clock inputs of the nth multiplexing drive unit's second and fourth pulse generators are coupled to input clock signal (n+5 modulo 2*N); and the third clock inputs of the nth multiplexing drive unit's second and fourth pulse generators are coupled to input clock signal (n+7 modulo 2*N).

14. A serializing transmitter with 2-tap pre-emphasis, comprising a first serializing transmitter of claim 13 and a second serializing transmitter of claim 13, wherein the outputs of the first and second serializing transmitters are coupled together.

15. The serializing transmitter with 2-tap pre-emphasis of claim 14, wherein:

parallel data signals 0-7, each exhibiting data transitions, are asserted on data inputs 0-7 of the first serializing transmitter of claim 14;

a complement of parallel data signals 0-6 are asserted on respective data inputs 1-7 of the second serializing transmitter of claim 14;

a complement of parallel data signal 7 is asserted on data input 0; and said complements of parallel data signals 0-7 exhibit logic transitions, and said logic transitions are delayed from corresponding logic transitions of parallel data signals 0-7 by a time substantially equal to one pulse width.

16. A differential serializing transmitter with pre-emphasis, comprising first and second serializing transmitters with pre-emphasis of claim 15, wherein:

for each data input of the first serializing transmitter with pre-emphasis of claim 15 coupled to a data signal, the corresponding data input of the second serializing transmitter with pre-emphasis is coupled to a complement of the data signal; and for each clock input of the first serializing transmitter with pre-emphasis of claim 15 coupled to a clock signal, the corresponding clock input of the second serializing transmitter with pre-emphasis is coupled to the clock signal.

* * * * *

UNITED STATES PATENT AND TRADEMARK OFFICE
CERTIFICATE OF CORRECTION

PATENT NO. : 8,415,980 B2
APPLICATION NO. : 13/170585
DATED : April 9, 2013
INVENTOR(S) : Alan S. Fiedler It is certified that error appears in the above-identified patent and that said Letters Patent is hereby corrected as shown below:

Title page, References Cited under "Other Publications" column 2, line 1, delete "Daivd" and insert -- David --, therefor.

Signed and Sealed this
Third Day of February, 2015

Michelle K. Lee
*Deputy Director of the United States Patent and Trademark Office*